United States Patent
Huang et al.

(10) Patent No.: US 9,307,677 B2
(45) Date of Patent: Apr. 5, 2016

(54) ELECTRONIC DEVICE WITH COMPONENT DETACHING FUNCTION

(71) Applicant: Wistron Corporation, New Taipei (TW)

(72) Inventors: Yao-De Huang, New Taipei (TW);
Jeng-Ming Lai, New Taipei (TW);
Ming-Wei Tien, New Taipei (TW)

(73) Assignee: Wistron Corporation, Hsichih, New Taipei (TW)

(*) Notice: Subject to any disclaimer, the term of this patent is extended or adjusted under 35 U.S.C. 154(b) by 165 days.

(21) Appl. No.: 14/188,712

(22) Filed: Feb. 25, 2014

(65) Prior Publication Data
US 2015/0146381 A1    May 28, 2015

(30) Foreign Application Priority Data

Nov. 26, 2013  (TW) .............................. 102143047 A

(51) Int. Cl.
*H05K 7/14* (2006.01)
*H05K 7/20* (2006.01)

(52) U.S. Cl.
CPC ........ *H05K 7/20727* (2013.01); *H05K 7/20172* (2013.01)

(58) Field of Classification Search
CPC .......... H05K 13/0486; H05K 7/20145; H05K 7/20172; H05K 7/20727; G06F 1/20
USPC .......... 29/762; 361/695, 727, 679.46, 679.48, 361/679.5, 679.49, 694, 732
See application file for complete search history.

(56) References Cited

U.S. PATENT DOCUMENTS

| | | | | |
|---|---|---|---|---|
| 5,791,753 A * | 8/1998 | Paquin | ................. | H05K 7/1411 312/223.1 |
| 6,999,313 B2 * | 2/2006 | Shih | ................... | H05K 7/20172 165/104.33 |
| 7,054,155 B1 * | 5/2006 | Mease | ................ | H05K 7/20581 165/104.34 |
| 7,586,745 B1 * | 9/2009 | Szelong | ............. | H05K 7/20727 361/690 |
| 8,451,605 B2 * | 5/2013 | Chen | ........................ | G06F 1/20 361/679.48 |

(Continued)

FOREIGN PATENT DOCUMENTS

TW         M379099        4/2010

OTHER PUBLICATIONS

Office action mailed on Jun. 3, 2015 for the Taiwan application No. 102143047, filing date: Nov. 26, 2013, p. 1 line 1-10, p. 2-3 and p. 4 line 1-18.

*Primary Examiner* — Robert J Hoffberg
*Assistant Examiner* — Michael Matey
(74) *Attorney, Agent, or Firm* — Winston Hsu; Scott Margo

(57) ABSTRACT

An electronic device with component detaching function includes a casing, a cover and an electronic component. An opening is formed on the casing. The cover is adapted to shelter the opening. The cover is movably disposed on the casing close to the opening, and can move relative to the casing to be switched between a first position and a second portion. The cover includes a first connecting portion. The electronic component including a second connecting portion is detachably disposed on the opening. The second connecting portion is detachably assembled with the first connecting portion. When the electronic component is separated from the casing, the electronic component utilizes an assembly of the first connecting portion and the second connecting portion to slide the cover relative to the casing, and the cover moves from the first position to the second portion.

12 Claims, 9 Drawing Sheets

(56) References Cited

U.S. PATENT DOCUMENTS

| | | | |
|---|---|---|---|
| 2003/0099094 A1* | 5/2003 | Coles | H05K 7/20172 361/726 |
| 2003/0123222 A1* | 7/2003 | Thompson | H05K 7/20581 361/679.48 |
| 2004/0256334 A1* | 12/2004 | Chen | H05K 7/20727 211/41.17 |
| 2006/0002093 A1* | 1/2006 | Carlson | G11B 33/128 361/726 |
| 2006/0285292 A1* | 12/2006 | Fan | H05K 7/20172 361/695 |
| 2009/0294107 A1* | 12/2009 | Nishiyama | G06F 1/20 165/104.34 |
| 2010/0053879 A1* | 3/2010 | Miyamoto | G11B 33/128 361/679.13 |
| 2011/0122573 A1* | 5/2011 | Peng | H05K 7/20727 361/679.48 |
| 2011/0216498 A1* | 9/2011 | Lee | G06F 1/20 361/679.33 |
| 2011/0255241 A1* | 10/2011 | Wu | G06F 1/181 361/679.54 |
| 2013/0058781 A1* | 3/2013 | Fu | H05K 7/20581 415/220 |
| 2014/0002986 A1* | 1/2014 | Guan | G06F 1/183 361/679.48 |

* cited by examiner

US 9,307,677 B2

ELECTRONIC DEVICE WITH COMPONENT DETACHING FUNCTION

BACKGROUND OF THE INVENTION

1. Field of the Invention

The present invention relates to an electronic device with component detaching function, and more particularly, to an electronic device with the component detaching function and capable of automatically forming an enclosed environment.

2. Description of the Prior Art

The cloud server cannot shut down even through an inner electronic component is broken and has to be replaced or repaired. Generally, failure rate of a thermal fan is higher than the other components of the cloud server. After the damaged fan is detached, an opening of the server casing is exposed and a direction of the flow field is varied before the substitutive fan is installed, so that heat dissipating efficiency of the cloud server is decreased. Thus, how to maintain the heat dissipating efficiency of the cloud server during the repair period is an important issue in the related industry. One of the conventional solutions disposes a soft windshield by sides of the opening on the server casing. When the fan is removed from the opening, the windshield can shelter the opening by a torsional spring, so as to prevent the wind flow from varying. Due to structural design constraint, cover rate of the soft windshield cannot completely shelter the opening, and the torsional spring may be resilient fatigue by long-term use, which results in low heat dissipating efficiency of the cloud server. The other conventional solution utilizes a rigid windshield, which is a separated structure independent of the cloud server. As the damaged fan is removed, the rigid windshield is manually disposed over the casing to shelter the opening. Manual procedure of replacing the rigid windshield is inconvenient, and the heat dissipating efficiency of the cloud server may be decreased easily due to artificial error.

SUMMARY OF THE INVENTION

The present invention provides an electronic device with the component detaching function and capable of automatically forming an enclosed environment for solving above drawbacks.

According to the claimed invention, an electronic device with component detaching function is disclosed. The electronic device includes a casing, a cover and an electronic component. An opening is formed on the casing. The cover is movably disposed on the casing and adjacent to the opening for sheltering the opening, and is further adapted to move relative to the casing for being switched between a first position and a second position. The cover includes a first connecting portion. The electronic component is detachably disposed inside the opening. The electronic component includes a second connecting portion detachably assembled with the first connecting portion. The first connecting portion is assembled with the second connecting portion when the electronic component is disposed inside the opening so as to locate the cover at the first position. The electronic component utilizes an assembly of the first connecting portion and the second connecting portion to slide the cover relative to the casing when the electronic component is separated from the casing, so as to move the cover from the first position to the second position.

According to the claimed invention, a planar normal vector of the cover is substantially parallel to a planar normal vector of a lateral wall of the casing when the cover is located at the first position. The cover rotates relative to the casing via an edge of the cover to shelter the opening when the cover is located at the second position and the first connecting portion is disassembled from the second connecting portion.

The present invention utilizes the theory of action force and reaction force to overcome the wind resistance, so as to increase service life and the cover rate of the cover. The electronic device can automatically form an enclosed environment after the electronic component is detached, to prevent the flow field from generating the bypass effect, so as to effectively increase heat dissipating efficiency of the electronic device. The present invention not only can decrease repair procedures to avoid artificial error, but also can increase the heat dissipating efficiency of the electronic device during repair period of the fan unit, for preferred repair efficiency and increase of repair cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
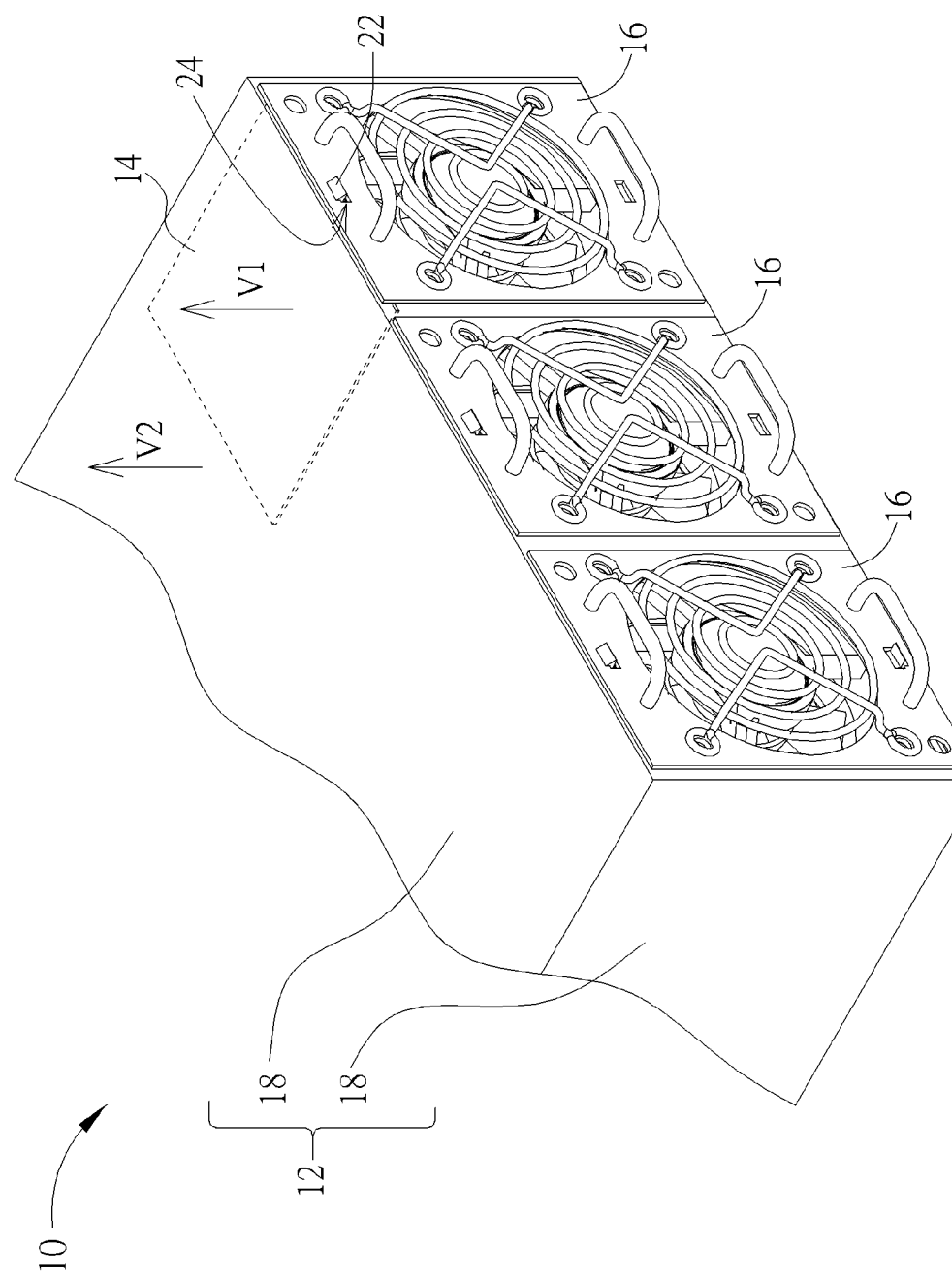
FIG. 1 and FIG. 2 respectively are diagrams of an electronic device according to a first embodiment of the present invention.
Figure 2:
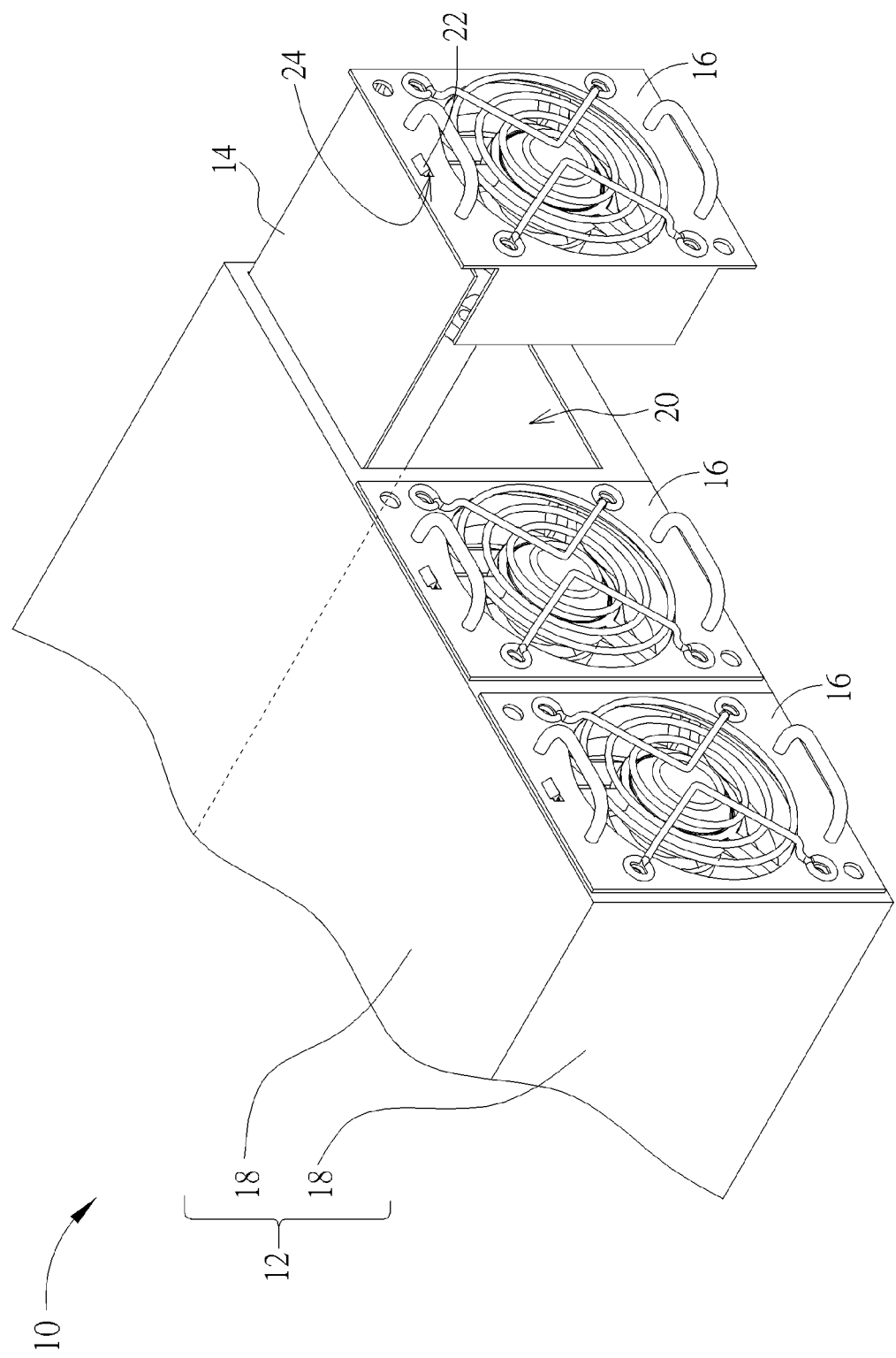

Please refer to FIG. 1 and FIG. 2. FIG. 1 and FIG. 2 respectively are diagrams of an electronic device 10 according to a first embodiment of the present invention. The electronic device 10 includes a casing 12, a cover 14 and an electronic component 16. The casing 12 includes a plurality of lateral walls 18, and an opening 20 is formed on a side of the casing 12. Amounts of the cover 14 and the electronic component 16 correspond to an amount of the opening 20. The cover 14 is slidably disposed on the casing 12 adjacent to the opening 20, and is adapted to move relative to the casing 12 for being switched between a first position (as shown in FIG. 1) and a second position (as shown in FIG. 2). The cover 14 includes a first connecting portion 22. In this embodiment, the electronic component 16 can be a fan unit, which further can be replaced by the other components. The electronic component 16 includes a second connecting portion 24. The electronic component 16 detachably inserts into the opening 20 to assemble with the casing 12.

As shown in FIG. 1, the cover is 14 located at the first position. The cover 14 is disposed inside the casing 12 and parallel to the lateral wall 18, which means a planar normal vector V1 of the cover 14 can be substantially parallel to a planar normal vector V2 of the lateral wall 18. The electronic component 16 is disposed inside the opening 20, the first connecting portion 22 can be selectively assembled with the second connecting portion 24 to locate the cover 14 at the first position. The first connecting portion 22 is assembled with the second connecting portion 24, so the cover 14 can slide relative to the casing 12 with a movement of the electronic component 16. As the first connecting portion 22 is disassembled from the second connecting portion 24, the cover 14 does not link the electronic component 16, and cannot move by the movement of the electronic component 16. As shown in FIG. 2, the electronic component 16 moves out of the opening 20 to separate from the casing 12, the electronic component 16 utilizes an assembly of the first connecting portion 22 and the second connecting portion 24 to pull the cover 14 relative to the casing 12 outwardly, and the cover 14 moves from the first position to the second position. Meanwhile, the opening 20 is not sheltered by the cover 14.

Please refer to FIG. 3 to FIG. 6. FIG. 3 to FIG. 6 respectively are lateral views of the electronic device 10 in different operation modes according to the first embodiment of the present invention. The electronic device 10 shown in FIG. 1 corresponds to the operation mode shown in FIG. 3. The electronic device 10 shown in FIG. 2 corresponds to the operation mode shown in FIG. 4. The electronic device 10 further includes a slide track 26 and a supporting component 28. The slide track 26 can be disposed inside the casing 12. The supporting component 28 can be disposed by the slide track 26 and adjacent to the opening 20. The cover 14 is slidably switched between the first position and the second position relative to the casing 12 via the slide track 26. The supporting component 28 can contact against the cover 14 when the cover 14 moves along the slide track 26, so as to provide a stable upward force. The cover 14 includes a stopping portion 30, and a first end 141 and a second end 143 opposite to each other. The stopping portion 30 is disposed on the first end 141. The first end 141 is installed on the slide track 26 and slidably disposed on the casing 12. The first connecting portion 22 is disposed on the second end 143. The first connecting portion 22 is detachably assembled with the second connecting portion 24 of the electronic component 16.

Figure 3:
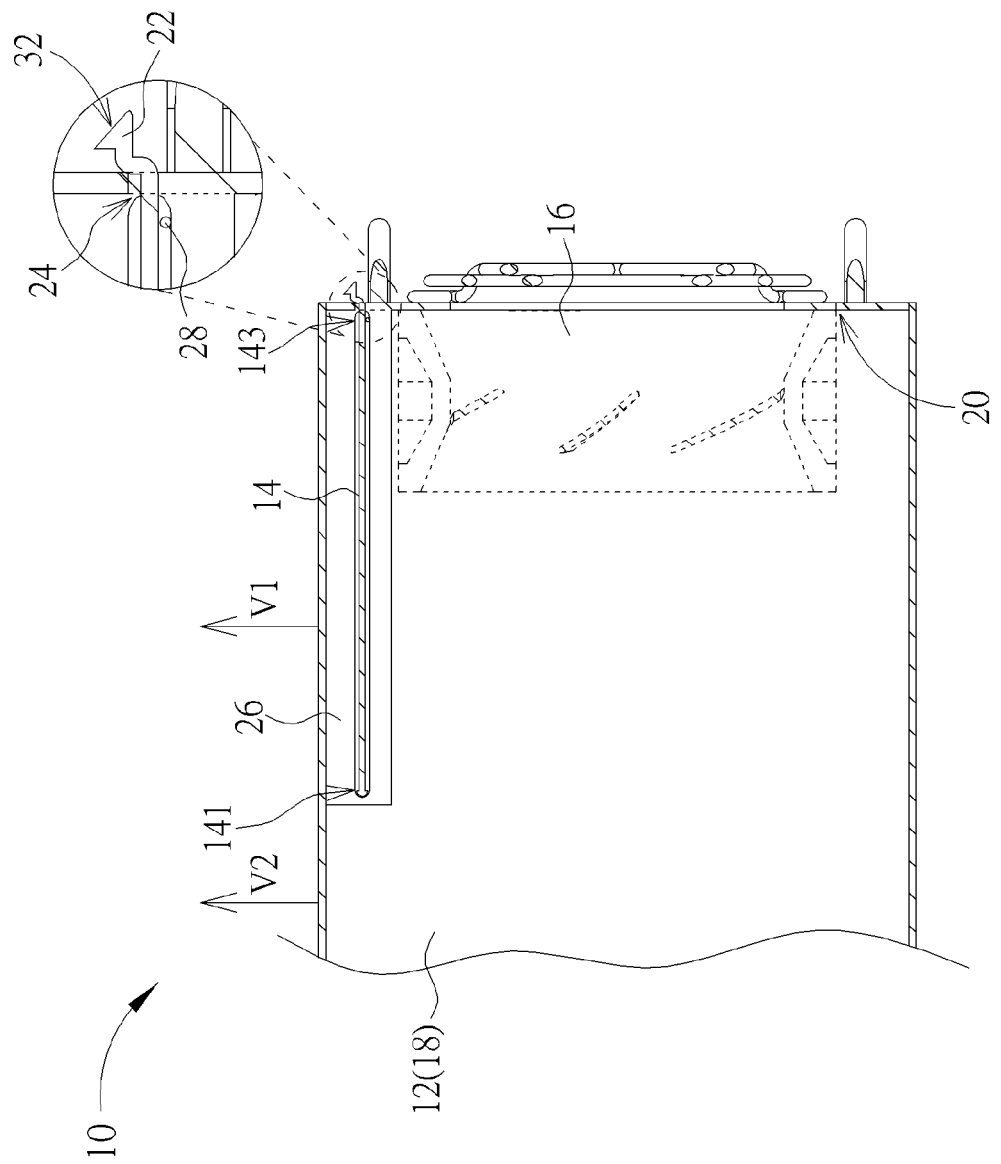
FIG. 3 to FIG. 6 respectively are lateral views of the electronic device in different operation modes according to the first embodiment of the present invention.
Figure 4:
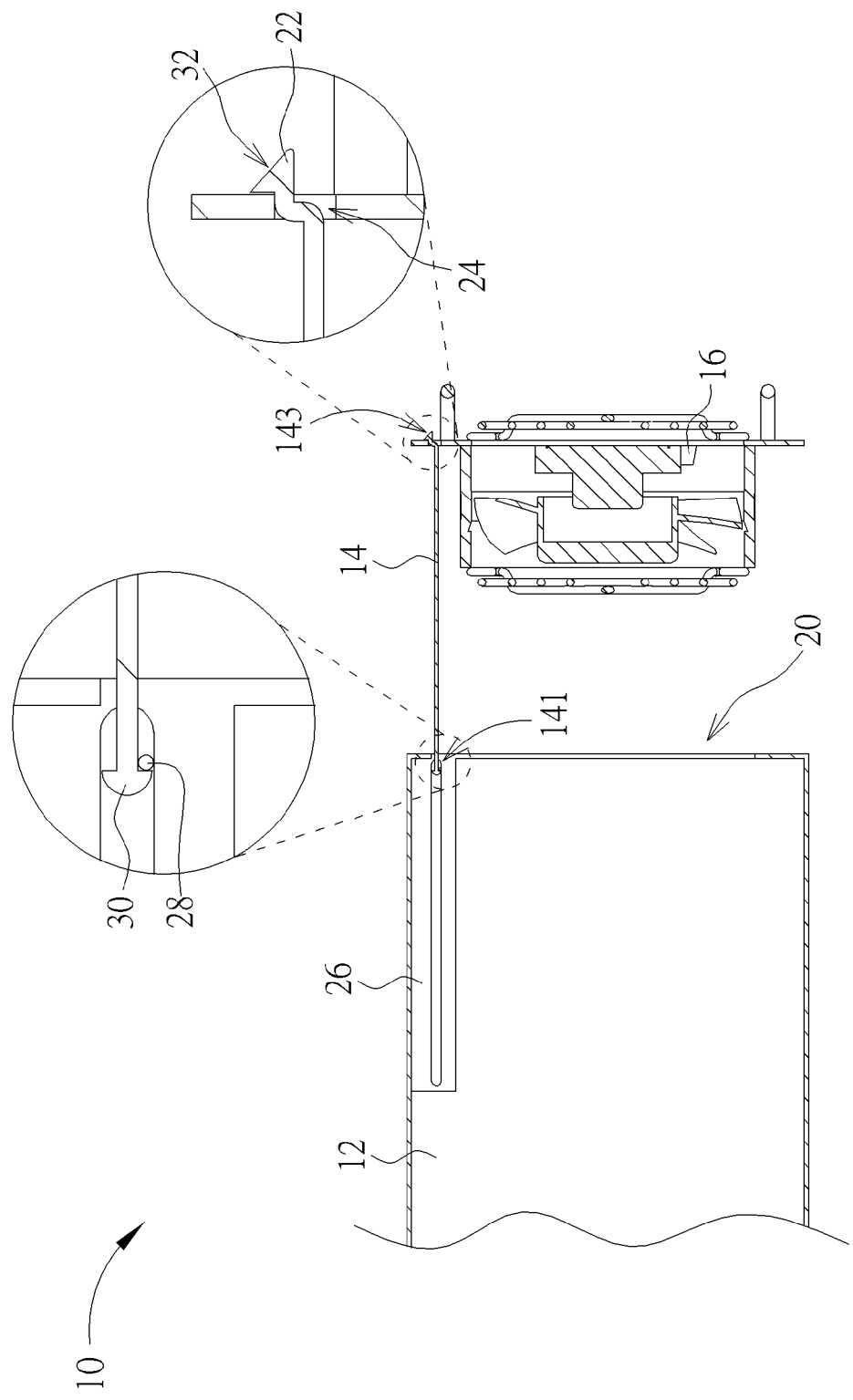

As shown in FIG. 3, the cover 14 hides inside the casing 12 and is located at the first position. The planar normal vector V1 is substantially parallel to the planar normal vector V2. The first connecting portion 22 of the cover 14 is assembled with the second connecting portion 24 of the electronic component 16, the electronic component 16 inserts into the opening 20 to form an enclosed structure. As shown in FIG. 4, the electronic component 16 moves relative to the casing 12 to be out of the opening 20. The cover 14 moves relative to the casing with the movement of the electronic component 16 by the assembly of the first connecting portion 22 and the second connecting portion 24. When the cover 14 is located at the second position, the first end 141 of the cover 14 is blocked by an end of the slide track 26, the stopping portion 30 contacts against the supporting component 28 to prevent the cover 14 and the slide track from separation. The first connecting portion 22 can be disassembled from the second connecting portion 24 by manual press or gravity.

Figure 5:
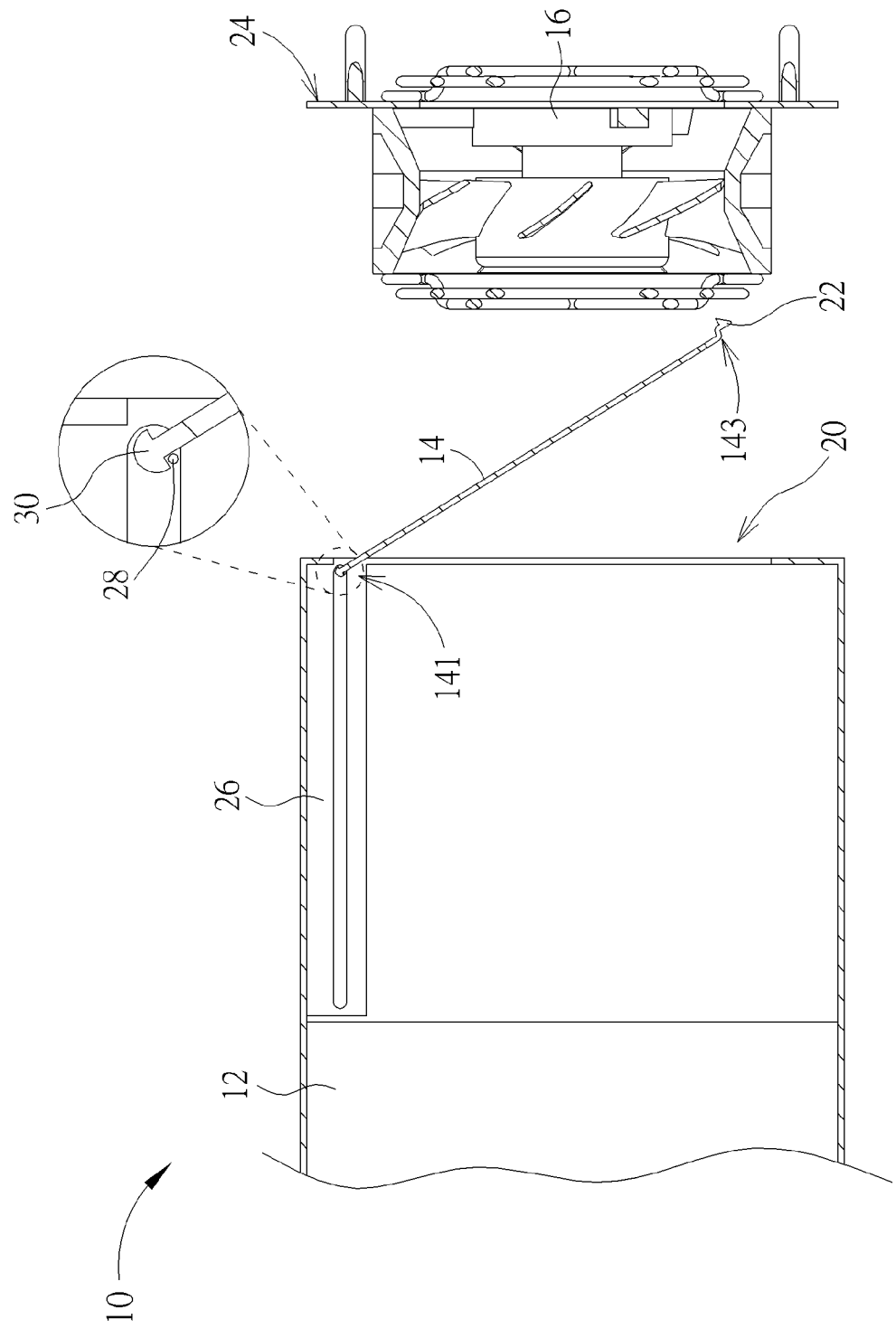
Figure 6:
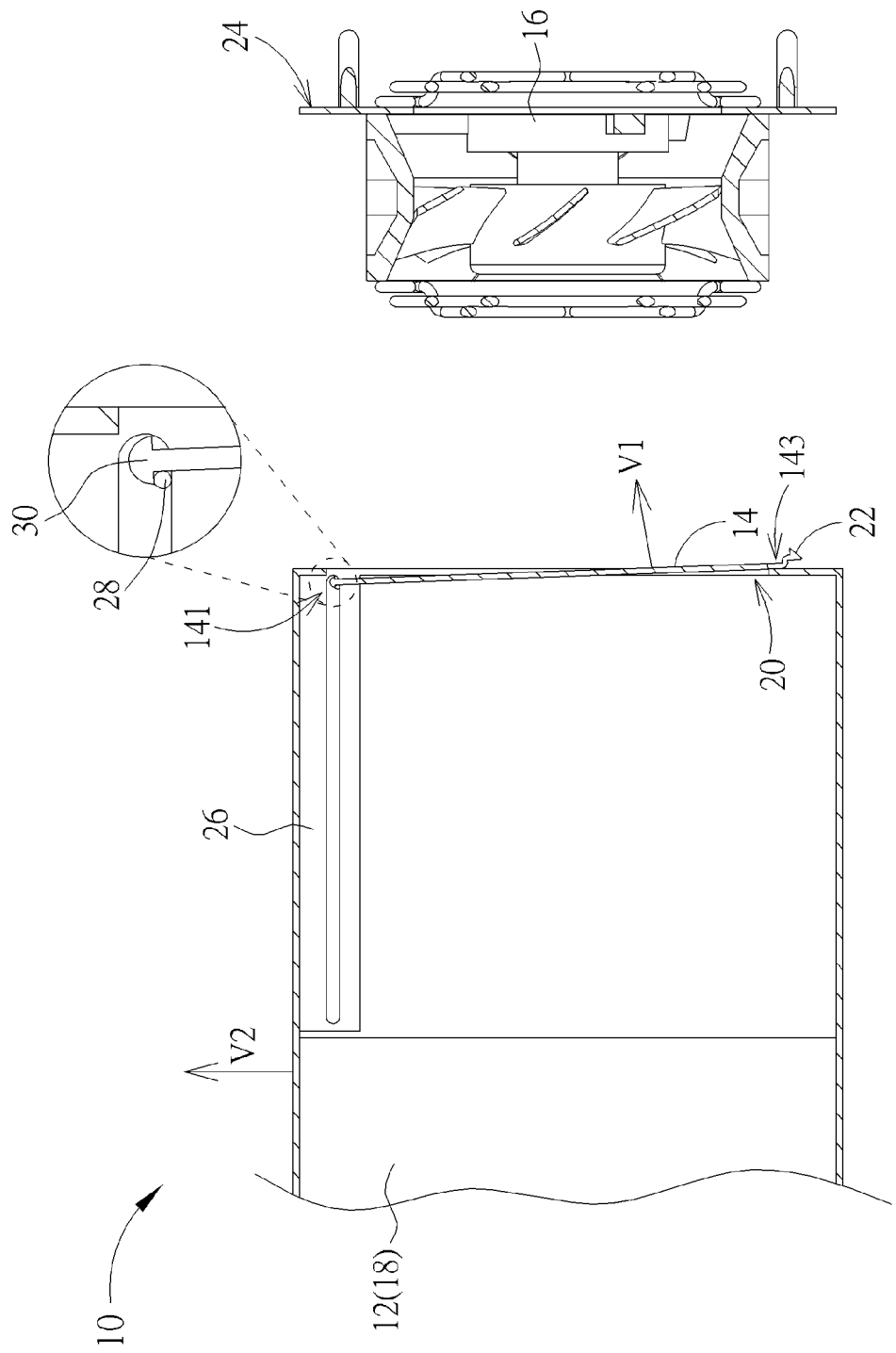

As shown in FIG. 5, the first connecting portion 22 is disassembled from the second connecting portion 24. The second end 143 of the cover 14 is not supported by the electronic component 16, the cover 14 rotates relative to the casing 12 via the first end 141 (which is an axle center). In the meantime, the stopping portion 30 rotates around the supporting component 28 at a clockwise direction, the cover 14 automatically falls due to the gravity or suction force generated by the fan unit (the electronic component 16). As shown in FIG. 6, dimensions of the cover 14 can be larger than dimensions of the opening 20. The first end 141 of the cover 14 is disposed on the slide track 26 inside the casing 12, the second end 143 of the cover 14 contacts against an outer surface of the casing 12, so that the cover 14 can fully shelter the opening 20. The planar normal vector V1 is substantially perpendicular to the planar normal vector V2.

In the first embodiment of the present invention, the first connecting portion 22 can be a hook, the second connecting portion 24 can be a corresponding slot. The cover 14 and the first connecting portion 22 can be made of resilient deformable material, and the hook is engaged with and disengaged from the slot in a resilient deformable manner. In addition, the first connecting portion 22 further includes an inclined structure 32 disposed on a top or a bottom of the first connecting portion 22. As shown in FIG. 3 and FIG. 4, the cover 14 is manually arose to accommodate into the slide track 26, and the electronic component 16 moves relative to the casing 12 to insert into the opening 20. When the electronic component 16 contacts the cover 14, the inclined structure 32 guides the first connecting portion 22 to generate resilient deformation, so as to release structural interference for assembling the first connecting portion 22 with the second connecting portion 24.

Figure 7:
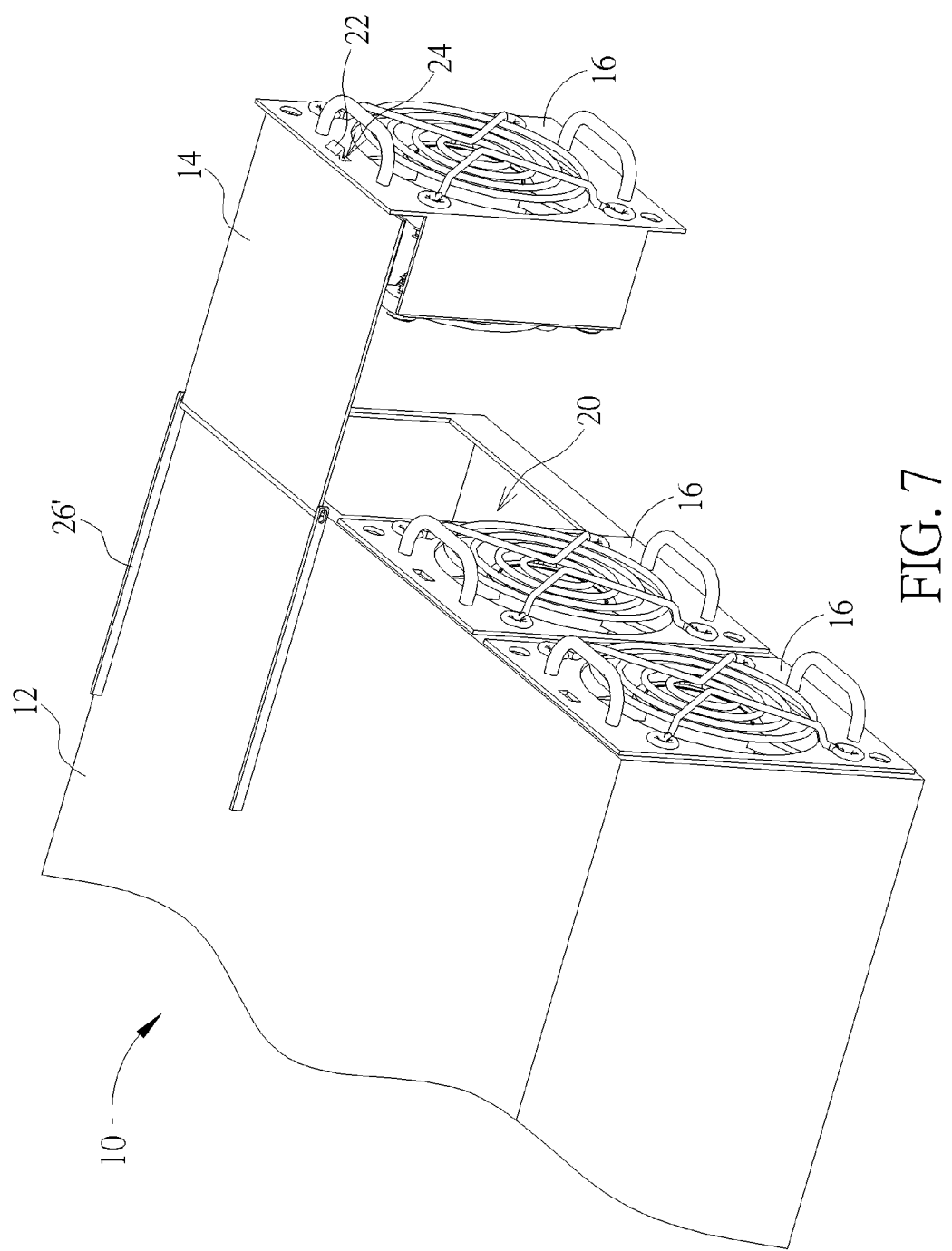
FIG. 7 is a diagram of the electronic device according to a second embodiment of the present invention.

Please refer to FIG. 7. FIG. 7 is a diagram of the electronic device 10 according to a second embodiment of the present invention.

In the second embodiment, elements having the same numeral as ones of the first embodiment have the same structures and functions, and a detailed description is omitted herein for simplicity. The slide track 26' of the second embodiment can be selectively disposed outside the casing 12, and the cover 14 slides relative to an outer surface of the casing 12. When the cover 14 partly protrudes from the slide track 26' with the movement of the electronic component 16, the cover 14 can immediately rotate and fall to shelter the opening 20 because of disassembly of the first connecting portion 22 and the second connecting portion 24. It should be mentioned that the first embodiment and the second embodiment respectively disposes the slide track 26 and 26' above the opening 20, however the slide track further can be disposed on lateral sides (such as a left side or a right side) of the opening 20. Application of the slide track is not limited to above-mentioned embodiments, and depends on design demand.

Figure 8:
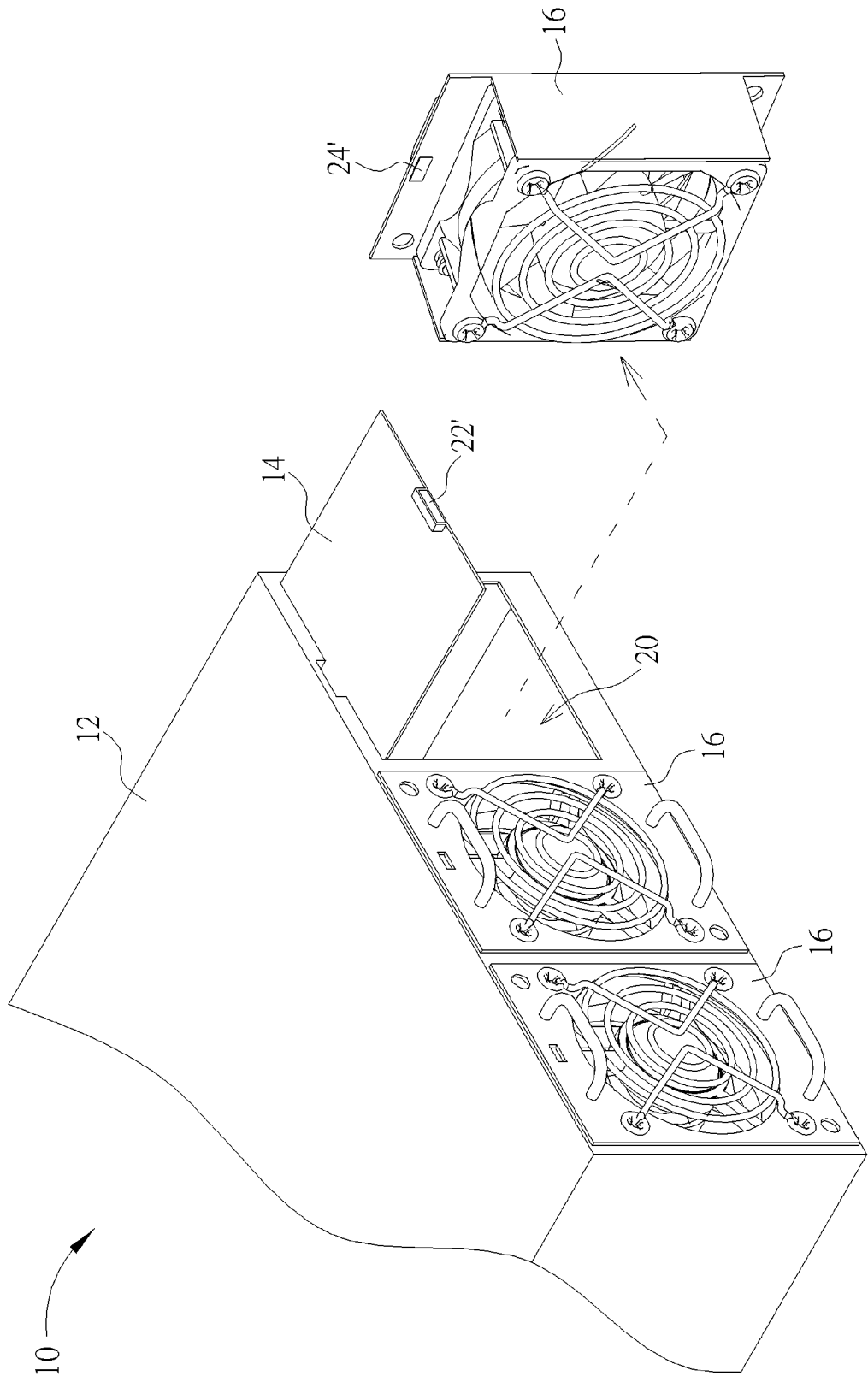
FIG. 8 is a diagram of the electronic device according to a third embodiment of the present invention.

Please refer to FIG. 8. FIG. 8 is a diagram of the electronic device 10 according to a third embodiment of the present invention. In the third embodiment, elements having the same numeral as ones of the above-mentioned embodiment have the same structures and functions, and a detailed description is omitted herein for simplicity. The first connecting portion 22' and the second connecting portion 24' of the third embodiment can respectively be magnetic components that face to each other by opposite magnet poles. For example, a positive pole of the first connecting portion 22' disposed on the cover 14 faces toward a negative pole of the second connecting portion 24' disposed on the electronic component 16. The electronic component 16 utilizes magnetic force to pull the cover 14 out of the casing 12. When a distance between the electronic component 16 and the casing 12 is greater than a length of the cover 14, the two magnetic components are spaced from each other and the magnetic induction force are decreased. The cover 14 rotatably falls by the gravity or the suction force of the fan unit (the electronic component 16), so as to automatically shelter the opening 20. Besides, the first connecting portion 22' and the second connecting portion 24' further can respectively be a magnetic component and a permeance component, the magnetic induction force between the magnetic component and the permeance component is utilized to move and to separate the cover 14 and the electronic component 16.

Figure 9:
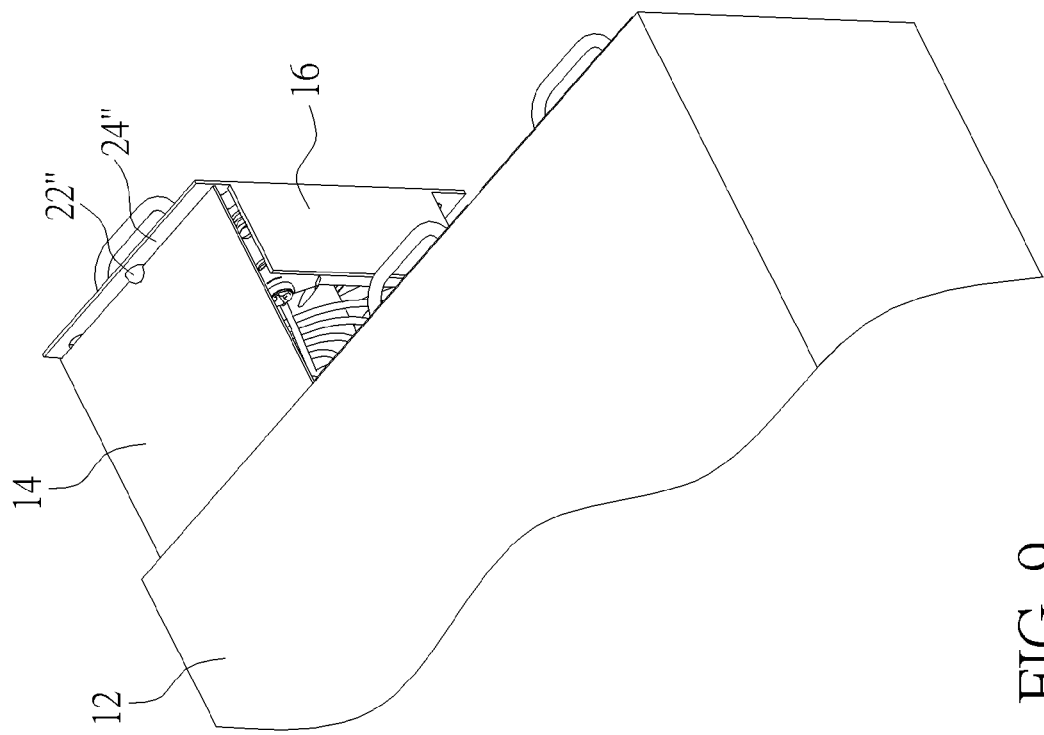
FIG. 9 is a diagram of the electronic device according to a fourth embodiment of the present invention.

Please refer to FIG. 9. FIG. 9 is a diagram of the electronic device 10 according to a fourth embodiment of the present invention. In the fourth embodiment, elements having the same numeral as ones of the above-mentioned embodiment have the same structures and functions, and a detailed description is omitted herein for simplicity. The first connecting portion 22" of the fourth embodiment can be a suction component, such as a vacuum sucking disk. The second connecting portion 24" can be a corresponding flat surface. When the electronic component 16 contacts the cover 14, air inside the first connecting portion 22" can be exhausted by structural deformation of the first connecting portion 22", the first connecting portion 22" generates vacuum suction force to assemble with the second connecting portion 24", so as to link the cover 14 and the electronic component 16. Vacuum condition of the first connecting portion 22" can be damaged by compression, the first connecting portion 22" and the second connecting portion 24" are disengaged, and the cover 14 is accordingly separated from the electronic component 16.

The present invention discloses the electronic device with component detaching function. The electronic device can be a server, which is unable to be shut down no matter what condition the server meets. The electronic component is a heat-dissipating fan unit. The slide track and the supporting component are utilized to accommodate the cover when the electronic device is in normal condition. As the electronic component is detached from the casing, heat-dissipating flow field of the electronic device maybe damaged due to the exposed opening. Therefore, the detachable assembly of the first connecting portion and the second connecting portion is utilized to drive the cover to automatically and immediately shelter the opening when the electronic component is separated from the casing, so as to form resistance with a high cover rate, and to prevent the other undetached fan unit from generating bypass effect due to the exposed opening. Furthermore, the cover utilizes theory of action force (the suction force from the fan unit) and reaction force (an ambient pressure) to overcome the wind resistance, cover rate of the cover is not decreased because of material property of the cover and frequent replacement of the fan unit. Applications of the first connecting portion and the second connecting portion are not limited to the above-mentioned embodiments, for example, the connecting portions further can be a buckling mechanism or reuse adhesive, components with rapid and convenient detaching function belongs to scope of the present invention.

Comparing to the prior art, the present invention utilizes the theory of action force and reaction force to overcome the wind resistance, so as to increase service life and the cover rate of the cover. The electronic device can automatically form an enclosed environment after the electronic component is detached, to prevent the flow field from generating the bypass effect, so as to effectively increase heat dissipating efficiency of the electronic device. The present invention not only can decrease repair procedures to avoid artificial error, but also can increase the heat dissipating efficiency of the electronic device during repair period of the fan unit, for preferred repair efficiency and increase of repair cost.

Those skilled in the art will readily observe that numerous modifications and alterations of the device and method may be made while retaining the teachings of the invention. Accordingly, the above disclosure should be construed as limited only by the metes and bounds of the appended claims.

what is claimed is:

1. An electronic device with component detaching function, the electronic device comprising:
   a casing whereon an opening is formed;
   a cover movably disposed on the casing adjacent to the opening, the cover being hidden inside the casing while being located at a first position, and the cover further rotating relative to the casing for sheltering the opening while being switched to a second position, the cover comprising a first connecting portion; and
   an electronic component detachably disposed inside the opening, the electronic component comprising a second connecting portion detachably assembled with the first connecting portion, the first connecting portion being assembled with the second connecting portion when the electronic component is disposed inside the opening so as to locate the cover at the first position, the electronic component utilizing an assembly of the first connecting portion and the second connecting portion to slide the cover relative to the casing when the electronic component is separated from the casing so as to move the cover from the first position to the second position.

2. The electronic device of claim 1, wherein a planar normal vector of the cover is substantially parallel to a planar normal vector of a lateral wall of the casing when the cover is located at the first position.

3. The electronic device of claim 1, wherein the cover rotates relative to the casing via an edge of the cover to shelter the opening when the cover is located at the second position and the first connecting portion is disassembled from the second connecting portion.

4. The electronic device of claim 1, further comprising:
   a slide track disposed on the casing, the cover being slidably switched between the first position and the second position via the slide track.

5. The electronic device of claim 1, further comprising:
   a supporting component disposed by the slide track and adjacent to the opening for contacting against the cover.

6. The electronic device of claim 5, wherein the cover further comprises a stopping portion disposed on an edge of the cover, the stopping portion contacts against the supporting component when the cover moves to the second position.

7. The electronic device of claim 1, wherein the cover comprises a first end and a second end opposite to each other, the first end is slidably disposed on the casing, and the first connecting portion is disposed on the second end.

8. The electronic device of claim 1, wherein the first connecting portion is a hook, the second connecting portion is a slot, and the hook is engaged with the slot in a resilient deformable manner.

9. The electronic device of claim 8, wherein the first connecting portion comprises an inclined structure, the first connecting portion is assembled with the second connecting portion via the inclined structure.

10. The electronic device of claim 1, wherein the first connecting portion and the second connecting portion respectively are magnetic components facing to each other by opposite magnet poles.

11. The electronic device of claim 1, wherein the first connecting portion and the second connecting portion respectively are a magnetic component and a permeance component.

12. The electronic device of claim 1, wherein the first connecting portion is a suction component, the first connecting portion generates vacuum suction force to assemble with the second connecting portion.

* * * * *